US010116470B2

(12) United States Patent
Gu et al.

(10) Patent No.: US 10,116,470 B2
(45) Date of Patent: Oct. 30, 2018

(54) COMBINED LOW AND HIGH FREQUENCY CONTINUOUS-TIME LINEAR EQUALIZERS

(71) Applicant: Futurewei Technologies, Inc., Plano, TX (US)

(72) Inventors: Liang Gu, San Jose, CA (US); Yuming Cao, Pleasanton, CA (US); Yen Dang, San Jose, CA (US); Gong Lei, Sunnyvale, CA (US); Hungyi Lee, Cupertino, CA (US); Yifan Gu, Santa Clara, CA (US); Mamatha Deshpande, San Jose, CA (US); Shou-Po Shih, Cupertino, CA (US); Yan Duan, Ames, IA (US)

(73) Assignee: Futurewei Technologies, Inc., Plano, TX (US)

( * ) Notice: Subject to any disclaimer, the term of this patent is extended or adjusted under 35 U.S.C. 154(b) by 2 days.

(21) Appl. No.: 14/925,720

(22) Filed: Oct. 28, 2015

(65) Prior Publication Data

US 2017/0126443 A1 May 4, 2017

(51) Int. Cl.
*H04L 25/03* (2006.01)
*H03F 3/45* (2006.01)
(Continued)

(52) U.S. Cl.
CPC ....... *H04L 25/03878* (2013.01); *H03F 3/193* (2013.01); *H03F 3/45179* (2013.01);
(Continued)

(58) Field of Classification Search
CPC ......... H04L 25/03878; H04L 25/03254; H04L 27/01; H04L 25/03114; H04L 25/03019;
(Continued)

(56) References Cited

U.S. PATENT DOCUMENTS 7,499,489 B1 * 3/2009 Ellersick ........... H04L 25/03057
375/229
7,961,050 B1 * 6/2011 Swei ................... H03F 3/45183
330/254
(Continued)

FOREIGN PATENT DOCUMENTS

CN 101459632 A 6/2009
CN 102801666 A 11/2012
(Continued)

OTHER PUBLICATIONS

Minseo Kim, Joonsung Bae, Unsoo Ha, and Hoi-Jun Yoo, A 24-mW 28-Gb/s Wireline Receiver with Low-frequency Equalizing CTLE and 2-tap Speculative DFE, KAIST, Republic of Korea, May 2015.*
(Continued)

*Primary Examiner* — Aristocratis Fotakis
(74) *Attorney, Agent, or Firm* — Conley Rose, P.C.

(57) ABSTRACT

An apparatus comprising an input port configured to receive an input signal propagated through a transmission link, wherein the transmission link comprises a low-frequency channel loss and a high-frequency channel loss, a continuous-time linear equalization (CTLE) circuit coupled to the input port and configured to produce an output signal according to the input signal by applying a first gain to the input signal at a first frequency to compensate the low-frequency loss, and applying a second gain to the input signal at a second frequency to compensate the high-frequency channel loss, and an output port coupled to the CTLE circuit and configured to output the output signal.

18 Claims, 10 Drawing Sheets

(51) Int. Cl.
*H03F 3/193* (2006.01)
*H04B 10/69* (2013.01)

(52) U.S. Cl.
CPC .... *H04B 10/6971* (2013.01); *H04L 25/03114* (2013.01); *H04L 25/03159* (2013.01); *H03F 2200/451* (2013.01)

(58) Field of Classification Search
CPC .. H03F 3/45179; H03F 3/193; H04B 10/6971
See application file for complete search history.

(56) References Cited

U.S. PATENT DOCUMENTS

| | | | | |
|---|---|---|---|---|
| 8,200,179 | B1* | 6/2012 | Mosinskis | H03F 3/45183 375/233 |
| 8,335,249 | B1* | 12/2012 | Su | H04L 25/061 375/232 |
| 8,810,319 | B1* | 8/2014 | Chan | H03F 1/42 330/253 |
| 9,082,631 | B1* | 7/2015 | Lin | H01L 27/0629 |
| 9,143,241 | B2 | 9/2015 | Tsunoda | |
| 9,397,623 | B1* | 7/2016 | Lacroix | H03F 3/193 |
| 2006/0001504 | A1* | 1/2006 | Singh | H04L 25/03878 333/28 R |
| 2010/0290515 | A1* | 11/2010 | Dai | H04L 25/03057 375/232 |
| 2012/0263223 | A1* | 10/2012 | Rajaee | H04L 25/03885 375/232 |
| 2013/0215954 | A1* | 8/2013 | Beukema | G06G 7/184 375/233 |
| 2014/0077878 | A1* | 3/2014 | Hsieh | H03F 1/223 330/254 |
| 2014/0269130 | A1* | 9/2014 | Maeng | G11C 7/1084 365/207 |
| 2015/0222236 | A1* | 8/2015 | Takemoto | H03F 3/08 250/214 A |
| 2016/0020740 | A1* | 1/2016 | Arcudia | H03F 1/3211 330/261 |
| 2016/0254932 | A1* | 9/2016 | Chong | H04L 25/03019 375/233 |
| 2016/0277219 | A1* | 9/2016 | Venkatram | H04L 7/033 |
| 2017/0085239 | A1* | 3/2017 | Yuan | H03G 3/3036 |

FOREIGN PATENT DOCUMENTS

| | | |
|---|---|---|
| CN | 103746671 A | 4/2014 |
| CN | 104796092 A | 7/2015 |

OTHER PUBLICATIONS

Samir Parikh, Tony Kao, Yasuo Hidaka, Jian Jiang, Asako Toda, Scott Mcleod, William Walker, Yochi Koyanagi, Toshiyuki Shibuya, Jun Yamada, "A 32Gb/s Wireline Receiver with a Low-Frequency Equalizer, CTLE and 2-Tap DFE in 28nm CMOS", Fujitsu Laboratories, IEEE, 2013.*
Parikh, et al., "A 32GB/s Wireline Receiver with a Low-Frequency Equalizer, CTLE and 2-Tap DFE in 28nm CMOS," ISSCC 2013, Session 2, Ultra-High-Speed Transceivers and Equalizers 2.1, IEEE International Solid-State Circuits Conference, Feb. 18, 2013, pp. 28-30.
Partial English Translation and Abstract of Chinese Patent Application No. CN102801666, Sep. 5, 2016, 4 pages.
Partial English Translation and Abstract of Chinese Patent Application No. CN103746671, Sep. 5, 2016, 3 pages.
Partial English Translation and Abstract of Chinese Patent Application No. CN104796092, Sep. 5, 2016, 3 pages.
Foreign Communication From a Counterpart Application, PCT Application No. PCT/CN2015/096172, International Search Report dated Jul. 19, 2016, 7 pages.
Foreign Communication From A Counterpart Application, PCT Application No. PCT/CN2015/096172, Written Opinion dated Jul. 19, 2016, 4 pages.

* cited by examiner

COMBINED LOW AND HIGH FREQUENCY CONTINUOUS-TIME LINEAR EQUALIZERS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In telecommunication and data communication, equalization refers to the process of reversing a distortion experienced by a signal transmitted through a channel. Transmission channels, such as radio frequency (RF) channels, electrical wireline channels, and optical channels, may have non-flat frequency responses and non-linear phase responses. Equalizers are commonly employed in receiver frontends to compensate frequency-dependent amplitude and phase distortion in received signals prior to data decoding.

SUMMARY

In one embodiment, the disclosure includes an apparatus comprising an input port configured to receive an input signal propagated through a transmission link, wherein the transmission link comprises a low-frequency channel loss and a high-frequency channel loss, a continuous-time linear equalization (CTLE) circuit coupled to the input port and configured to produce an output signal according to the input signal by applying a first gain to the input signal at a first frequency to compensate the low-frequency loss, and applying a second gain to the input signal at a second frequency to compensate the high-frequency channel loss, and an output port coupled to the CTLE circuit and configured to output the output signal.

In another embodiment, the disclosure includes a method comprising obtaining a channel response of a transmission link comprising a low-frequency channel loss in a first frequency range and a high-frequency channel loss in a second frequency range, selecting a first resistance for a first resistor and a first capacitance for a first capacitor according to the second frequency range to compensate the high-frequency channel loss, and selecting a circuit element according to a parasitic capacitance of a transistor and the first frequency range to compensate the low-frequency channel loss.

In yet another embodiment, the disclosure includes an apparatus comprising a differential amplifier circuit comprising a first circuit branch and a second circuit branch connected to each other in parallel, a first transistor comprising a first gate and a first drain, wherein the first drain is coupled to the first circuit branch, a second transistor comprising a second gate and a second drain, wherein the second drain is coupled to the second circuit branch, a first resistor coupled to the first gate, and a second resistor coupled to the first resistor and the second gate such that the second resistor is positioned between the first resistor and the second gate.

In yet another embodiment, the disclosure includes an apparatus comprising a power supply, a differential amplifier circuit coupled to the power supply and comprising a first circuit branch, and a second circuit branch connected to the first circuit branch in parallel, a first transistor comprising a first gate, and a first drain coupled to the first circuit branch, a second transistor comprising a second gate, and a second drain coupled to the second circuit branch, a first reference current source coupled to the power supply, a third transistor comprising a third drain coupled to the first reference current source, and a third gate coupled to the first gate, a second reference current source coupled to the power supply, and a fourth transistor comprising a fourth drain coupled to the second reference current source, and a fourth gate coupled to the second gate.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although illustrative implementations of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A high-speed signal propagating through a wireline channel is exposed to high-frequency impairments such as reflections, dielectric loss, and loss due to the skin effect. These impairments may generate inter-symbol interference (ISI) and degrade the quality of the signal, causing a receiver to incorrectly decode the signal. In order to reliably decode the signal, a receiver may employ a CTLE circuit at the receiver frontend to compensate the channel loss.

Figure 1:
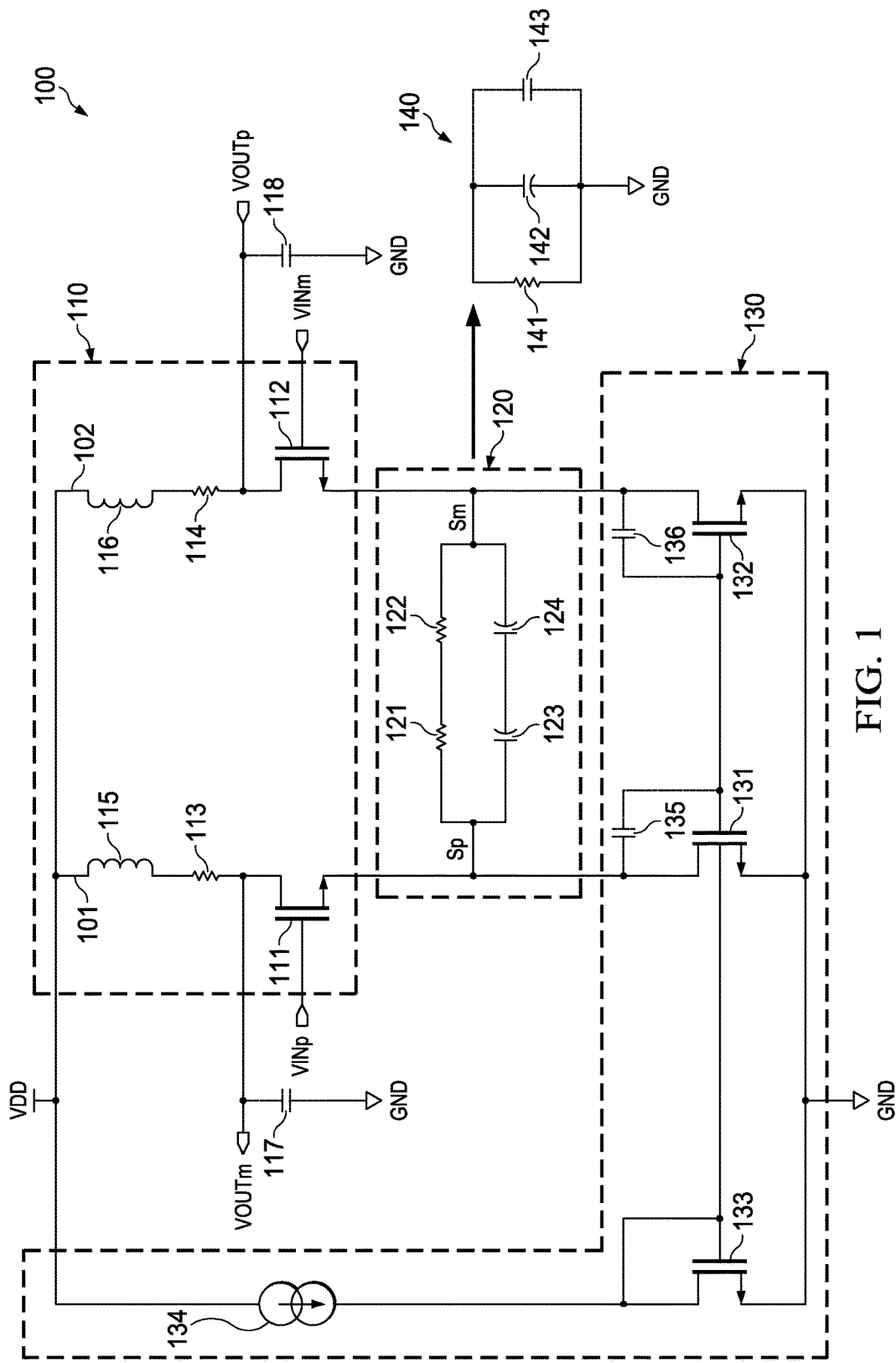
FIG. 1 is a schematic diagram of a CTLE circuit.

FIG. 1 is a schematic diagram of a CTLE circuit 100. The circuit 100 comprises a differential amplifier circuit 110, a frequency-shaping circuit 120, and a bias circuit 130. The differential amplifier circuit 110 comprises two matched n-channel metal-oxide semiconductor (NMOS) transistors 111 and 112, two matched resistors 113 and 114, and two matched inductors 115 and 116. Matched components refer to components comprising matching characteristics. For example, the transistors 111 and 112 comprise about the same current gain and about the same gate-source voltage, the resistors 113 and 114 comprise about the same resistance, and the inductors 115 and 116 comprise about the same inductance. The gates of the transistors 111 and 112 are configured to connect to a pair of differential input terminals VINP and VINM, respectively. The circuit 100 illustrates the positive and the negative components of a differential pair by a letter P and a letter M, respectively. The drains of the transistors 111 and 112 are configured to connect to a pair of differential output terminals VOUTM and VOUTP, respectively. The capacitance seen at the output terminals VOUTP and VOUTM are represented as capacitors 117 and 118. The resistor 113 and the inductor 115 are connected in series between the drain of the transistor 111 and a power supply voltage shown as $V_{DD}$. Similarly, the resistor 114 and the inductor 116 are connected in series between the drain of the transistor 112 and the power supply voltage. The differential amplifier circuit 110 amplifies the difference between a pair of differential signals input at VINP and VINM. The inductance of the inductors 115 and 116 are configured, in addition to the value of other components such as the capacitors 117 and 118 at the output terminals VOUTP and VOUTM, to provide a peak in the frequency response of the differential amplifier circuit 110 at a particular frequency to extend the bandwidth of the differential amplifier circuit 110 and the circuit 100.

The frequency-shaping circuit 120 is coupled to the differential amplifier circuit 110 at the sources of the transistors 111 and 112, which are shown as connection nodes SP and SM, respectively. The frequency-shaping circuit 120 comprises a series combination of two matched resistors 121 and 122 and a series combination of two matched capacitors 123 and 124, where the two series combinations are connected in parallel. The frequency-shaping circuit 120 reshapes the frequency response of the differential amplifier circuit 110. For example, the frequency-shaping circuit 120 may be configured to provide signal amplification at high frequencies, as described more fully below. As shown, the circuit 100 may be viewed as two symmetrical differential circuit branches 101 and 102 connected in parallel.

The bias circuit 130 is coupled to the differential amplifier circuit 110 and the frequency-shaping circuit 120 at the nodes SP and SM. The bias circuit 130 comprises three NMOS transistors 131, 132, and 133 and a reference current source 134. The drains of the transistors 131 and 132 are configured to connect to the sources of the transistors 111 and 112, respectively. The reference current source 134 is configured to connect between the power supply voltage $V_{DD}$ and the drain of the transistor 133. The sources of the transistors 131, 132, and 133 are connected to a ground shown as GND. The gate and the drain of the transistor 133 are connected to each other. The gate of the transistor 133 is further connected to each of the gates of the transistors 131 and 132. The transistors 131 and 132 operate as current sources to the circuit branches 101 and 102, respectively. The reference current source 134 controls the current sources provided by the transistors 131 and 132 such that a suitable direct current (DC) bias is provided to each of the circuit branches 101 and 102.

In the circuit 100, the parasitic capacitance of the transistors 131 and 132 also contribute to the frequency shaping in addition to the frequency-shaping circuit 120. The parasitic capacitances across the gates and drains of the transistors 131 and 132 are represented by capacitors 135 and 136, respectively. The parasitic capacitance across the gate and drain of a transistor such as the transistors 131 and 132 is referred to as a gate-drain capacitance, which may be fixed at a certain operating region of the transistor. To analyze the frequency shaping, the parasitic capacitances of the transistors 131 and 132 are combined with the resistor-capacitor (RC) network of the frequency-shaping circuit 120. A differential circuit may be represented as two half-circuits with equal gains and responses, one corresponding to the circuit branch 101 and the other corresponding to the circuit branch 102. The circuit 140 illustrates the equivalent half RC network across the nodes SP and SM. The circuit 140 comprises a resistor 141, a capacitor 142, and a capacitor 143 connected in parallel. When representing the half-circuit in the circuit branch 101, the resistor 141 and the capacitors 142 and 143 correspond to the resistor 121 and the capacitors 123 and 135, respectively. When representing the half-circuit in the circuit branch 102, the resistor 141 and the capacitors 142 and 143 correspond to the resistor 122 and the capacitors 124 and 136, respectively. The parallel configuration of the resistor 141 and the capacitors 142 and 143 produces a zero in the frequency response of the circuit 140.

The transfer function of the circuit 100 may be represented as a function of the components in the circuit 100. As an example, the resistance of the resistors 121 and 113 are represented as $R_S$ and $R_D$, respectively, the capacitance of the capacitors 123, 135, and 117 are represented as $C_S$, $C_{gd}$, and $C_L$, respectively, the inductance of the inductor 115 is represented as L, and the transconductance of the transistor 111 is represented as $g_{mD}$. Thus, the transfer function or frequency response H(s) of the circuit 100 is expressed as follows:

$$H(s) = -\frac{R_D}{R_s} \frac{(1 + sR_s(C_s + C_{gd}))\left(1 + s\frac{L}{R_D}\right)}{\left(1 + s\frac{C_s + C_{gd}}{g_{mD}}\right)(1 + sR_D C_L + s^2 L C_L)}, \quad (1)$$

where s is the complex number frequency. It should be noted that both the circuit branches 101 and 102 are symmetric, thus comprise the same transfer function H(s).

As can be seen from Equation (1), the transfer function H(s) comprises a first zero at an intermediate frequency, and a second zero, a real pole, and two conjugate poles at high frequencies. The frequency Z of the first zero at the intermediate frequency is as shown below:

$$Z = -\frac{1}{R_s(C_s + C_{gd})}. \quad (2)$$

As shown in Equation (2), the zero is dependent on the resistance of the resistor 121, the capacitance of the capacitor 123, and the gate-drain capacitance of the transistor 131. Thus, $R_S$ and $C_S$ may be selected to produce a certain frequency response for channel equalization. For example, to equalize a channel that attenuates high frequencies above 1 gigahertz (GHz), $R_S$ and $C_S$ may be configured according to $C_{gd}$ to produce a zero at about 1 GHz.

As described above, the inductors 115 and 116 extend the bandwidth of the circuit 100. To extend the bandwidth, the inductance of the inductors 115 and 116 are selected along with other components such as the capacitors 117 and 118 to produce a peak near a Nyquist frequency of an input signal at the differential input terminals VINP and VINM. For example, when the input signal comprises a data date of about 28 gigabits per second (Gbps), the inductances of the inductors 115 and 116 are configured along with the other components to produce two conjugate poles to form a peak at about 14 GHz for both of the circuit branch 101 and the circuit branch 102.

Figure 2:
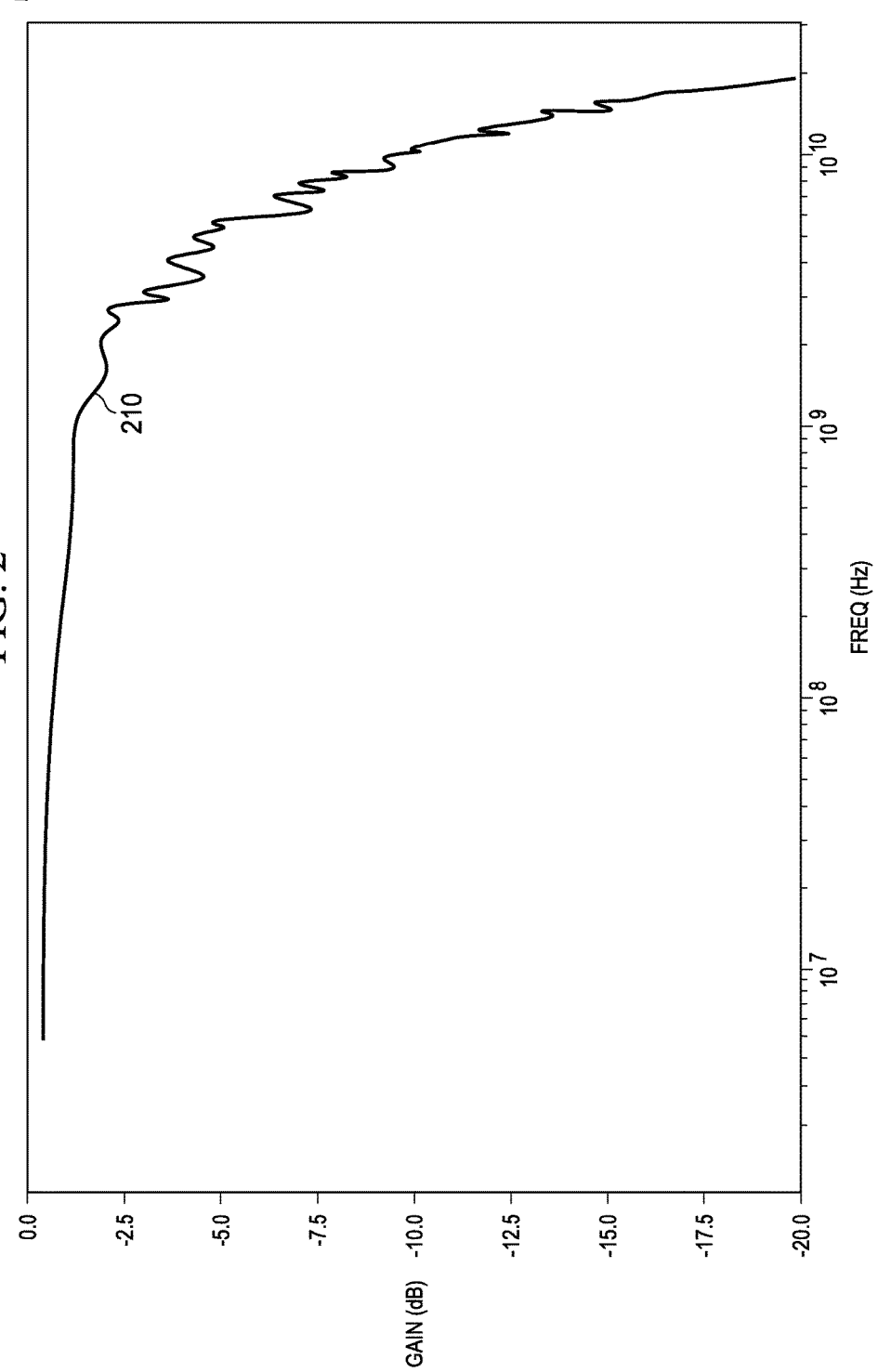
FIG. 2 is a graph illustrating a channel response of a transmission link.

FIG. 2 is a graph 200 illustrating a channel response 210 of a transmission link such as an electrical wire. The CTLE circuit 100 may be employed to equalize the channel response 210. The x-axis represents frequency in units of hertz (Hz) in a logarithmic scale. The y-axis represents gains in units of decibels (dB). The channel response 210 decays with increasing frequencies and the decay is substantially significant above 1 GHz. As shown, the attenuation is at −15 dB at about 14 GHz. The high-frequency attenuation in the frequency range of about 1 GHz and above may cause short-term ISI in a received signal, whereas the low-frequency attenuation in the frequency range between about 100 megahertz (MHz) to about 1 GHz may cause long-term ISI in the received signal.

Figure 3:
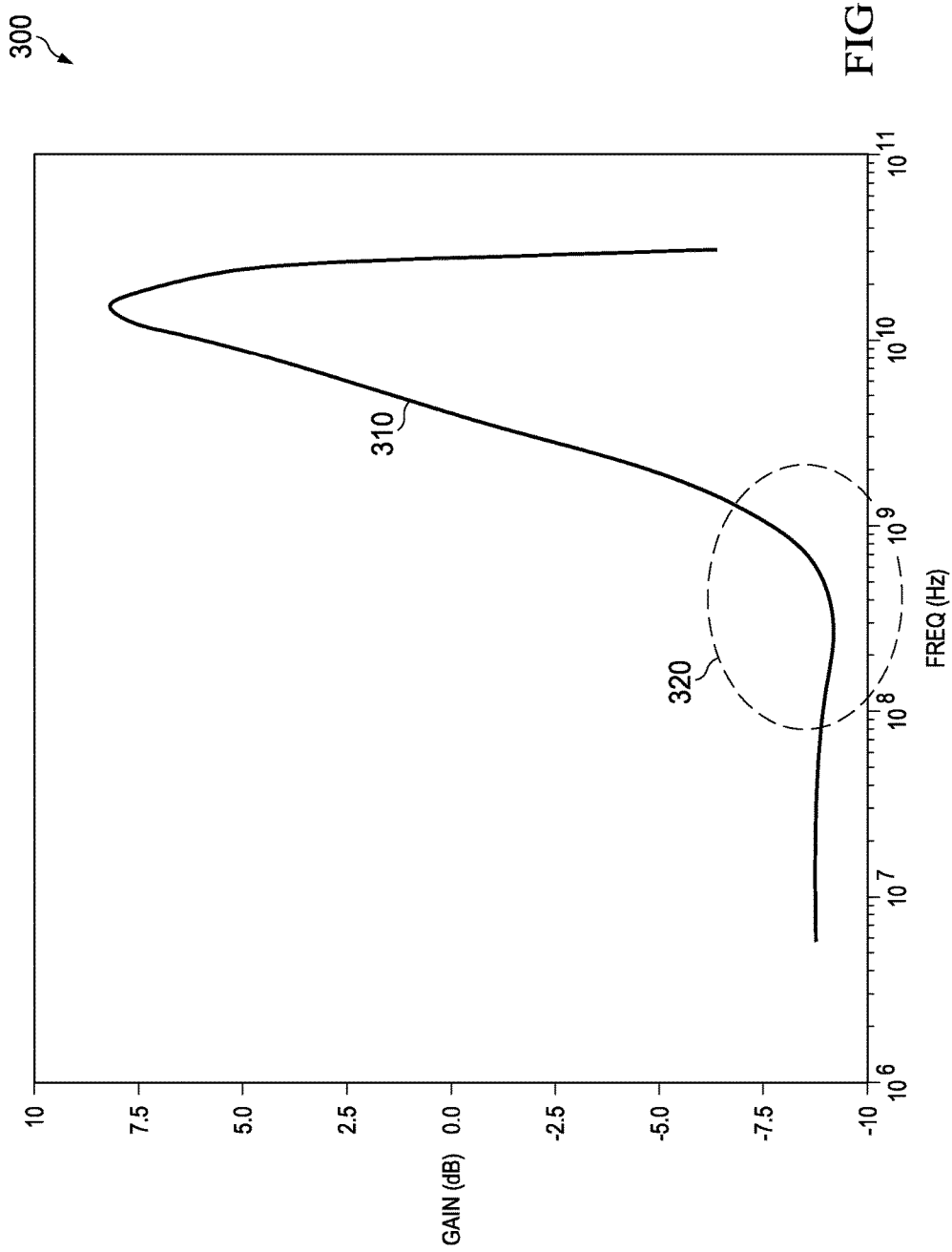
FIG. 3 is a graph illustrating a frequency response of the CTLE circuit of FIG. 1.

FIG. 3 is a graph 300 illustrating a frequency response 310 of the CTLE circuit 100. The x-axis represents frequency in units of Hz in a logarithmic scale. The y-axis represents gains in units of dB. The frequency response 310 is produced by configuring the circuit 100 to equalize the channel response 210 such that a received signal may comprise a frequency spectrum that is flat in the frequency band of the received signal. The circuit 100 may be located at a frontend of a receiver coupled to the transmission link. For example, the resistances of the resistors 121 and 122 and the capacitances of the capacitors 123 and 124 are configured to produce a zero at about 1 GHz in the frequency response of the circuit 100. In addition, the inductances of the inductors 115 and 116 are configured to produce two conjugate poles to form a peak at about 14 GHz. As shown, the frequency response 310 comprises a steep slope of about 20 dB/decade above 1 GHz, providing compensation or equalization to the short-term ISI. However, the frequency response 310 is almost flat in the region 320 between about 100 MHz and about 1 GHz, thus providing no compensation or equalization to the long-term ISI. In addition, the frequency response 310 comprises a dip at about 500 MHz, which may be caused by a previous stage in the frontend of the receiver frontend, further degrading the performance of the circuit 100. Thus, the circuit 100 may not invert the attenuation rate of the channel response 210 at low frequencies. One approach to providing both high- and low-frequency compensation is to employ active feedback technology with a CTLE. However, active feedback technology consumes more power and area, and thus may not be a desirable solution.

Disclosed herein are embodiments of an efficient CTLE that provides equalization at both low and high frequencies. The disclosed embodiments configure a CTLE circuit to produce at least a first pole, a first zero, and a second zero in a frequency response of the CTLE circuit. The frequency locations of the first pole and the first zero are selected such that the first pole and the first zero may provide a gain to compensate low-frequency channel loss or long-term ISI. The frequency location of the second zero is selected such that the second zero may provide a gain to compensate high-frequency channel loss or short-term ISI. The CTLE circuit comprises a differential amplifier circuit, a frequency-shaping circuit, and a bias circuit. The frequency-shaping circuit is coupled to the differential amplifier circuit to provide frequency-shaping to the differential amplifier circuit. For example, the frequency-shaping circuit may comprise a parallel RC network configured to produce a second zero for compensating the high-frequency channel loss. The bias circuit provides two branches of bias current sources to the differential amplifier circuit. In one embodiment, two resistors are connected between the gates of the two bias current sources, where the resistance of the two resistors are selected to produce a first zero and a first pole for compensating the low-frequency channel loss. In another embodiment, the bias circuit employs two separate reference current sources, each coupled to a diode-connected transistor, to separately bias a pair of differential circuit branches of the differential amplifier circuit, where the transconductances of the diode-connected transistors are selected to produce the first pole and the first zero. The first pole in the embodiments is used to exactly invert the attenuation rate in the low frequency range. The disclosed embodiments are suitable for use in high-speed systems such as optical modules operating up to about 100 Gbps. Although the present disclosure describes the CTLE circuit in the context of metal-oxide-semiconductor field-effect transistors (MOSFETs), other type of transistors such as bipolar junction transistors (BJTs) may also be employed to achieve similar functionalities.

Figure 4:
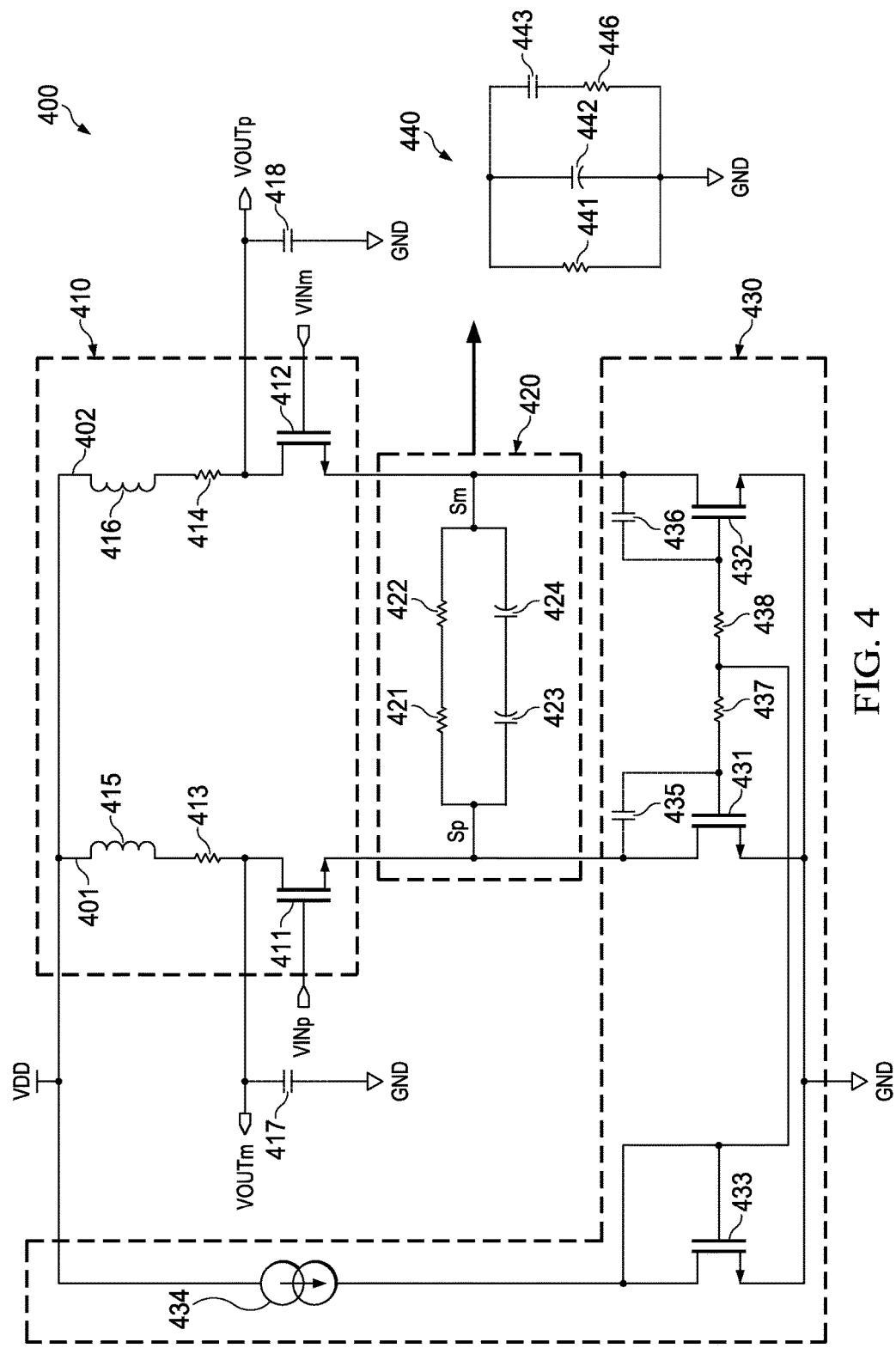
FIG. 4 is a schematic diagram of a CTLE circuit that compensates both high-frequency channel loss and low-frequency channel loss according to an embodiment of the disclosure.

FIG. 4 is a schematic diagram of a CTLE circuit 400 that compensates both high-frequency channel loss and low-frequency channel loss according to an embodiment of the disclosure. The circuit 400 produces two zeros, one at a low frequency and another at an intermediate frequency, in a frequency response of the circuit 400 instead of a single zero at the intermediate frequency as in the circuit 100. The additional zero located at the low frequency is to provide low-frequency gain for long-term ISI compensation. The circuit 400 also produces two conjugate poles to form a peak at a Nyquist frequency to provide high-frequency gain for short-term ISI compensation. The circuit 400 further comprises a differential amplifier circuit 410, a frequency-shaping circuit 420, and a bias circuit 430. The differential amplifier circuit 410 comprises two matched NMOS transistors 411 and 412, two matched resistors 413 and 414, and two matched inductors 415 and 416. The gates of the transistors 411 and 412 are provided as differential input terminals VINP and VINM, respectively. The drains of the transistors 411 and 412 are provided as differential output terminals VOUTM and VOUTP, respectively. The capacitance at the output terminals VOUTP and VOUTM are represented as capacitors 417 and 418. The resistor 413 and the inductor 415 are connected in series between the drain of the transistor 411 and a power supply voltage $V_{DD}$. Similarly, the resistor 414 and the inductor 416 are connected in series between the drain of the transistor 412 and $V_{DD}$. The differential amplifier circuit 410 provides signal amplification through the transistors 411 and 412 and bandwidth extension through the inductors 415 and 416.

The frequency-shaping circuit 420 comprises a series combination of two matched resistors 421 and 422 connected in parallel with a series combination of two matched capacitors 423 and 424. The frequency-shaping circuit 420 is coupled to the differential amplifier circuit 410 at the sources of the transistors 411 and 412 shown as connection nodes SP and SM, respectively. The frequency-shaping circuit 420 shapes a frequency response of the differential amplifier circuit 410. As shown, the circuit 400 may be viewed as two symmetrical differential circuit branches 401 and 402 connected in parallel.

The bias circuit 430 is coupled to the differential amplifier circuit 410 and the frequency-shaping circuit 420 at SP and SM. The bias circuit 430 comprises three NMOS transistors 431, 432, and 433, a reference current source 434, and resistors 437 and 438. The drains of the transistors 431 and 432 are configured to connect to the sources of the transistors 411 and 412, respectively. The reference current source 434 is configured to couple between the drain of the transistor 433 and $V_{DD}$. The sources of the transistors 431, 432, and 433 are connected to a ground shown as GND. The gate and drain of the transistor 433 are connected to each other. The resistors 437 and 438 are connected in series between the gates of the transistors 431 and 432. The gate of the transistor 433 is further connected to a connection point between the resistors 437 and 438. The reference current source 434 is configured to provide suitable DC biases to the circuit branches 401 and 402 via the transistors 431 and 432.

Similar to the transistors 131 and 132, the transistors 431 and 432 comprise parasitic capacitances across the gates and the sources. The parasitic capacitances are represented as capacitors 435 and 436. The circuit 440 illustrates the equivalent half RC network across SP and SM. The circuit 440 comprises resistors 441 and 446 and capacitors 442 and 443. When representing the half-circuit in the circuit branch 401, the resistors 441 and 446 and the capacitors 442 and 443 correspond to the resistors 421 and 437 and the capacitors 423 and 435, respectively. When representing the half-circuit in the circuit branch 402, the resistors 441 and 446 and the capacitors 442 and 443 correspond to the resistors 422 and 438 and the capacitors 424 and 436, respectively. The resistor 446 and the capacitor 443 are connected in series. The resistor 441, the capacitor 442, and the series combination of the resistor 446 and the capacitor 443 are connected in parallel. The resistor 441 and the capacitor 442 produce a second zero in the frequency response of the circuit 440. The resistors 441 and 446 and the capacitor 443 produce a first zero and a first pole in the frequency response.

The transfer function of the circuit 400 may be represented as a function of the components in the circuit 400. As an example, the resistance of the resistors 421, 437, and 413 are represented as $R_S$, $R_t$, and $R_D$, respectively; the capacitance of the capacitors 423, 435, and 417 are represented as $C_S$, $C_{gd}$, and $C_L$, respectively; the inductance of the inductor 415 is represented as L; and the transconductance of the transistor 411 is represented as $g_{mD}$. Thus, the transfer function or frequency response H(s) of the circuit 400 is expressed as follows:

$$H(s) = -\frac{R_D}{R_S} \frac{\left(1 + s\frac{R_S C_S R_t C_{gd}}{R_S C_S + (R_S + R_t)C_{gd}}\right)}{(1 + sR_t C_{gd})\left(1 + s\frac{C_S}{g_{mD}}\right)(1 + sR_D C_L + s^2 L C_L)} \left(1 + s(R_S C_S + (R_S + R_t)C_{gd})\right)\left(1 + s\frac{L}{R_D}\right) \quad (3)$$

Since the circuit branches 401 and 402 are symmetric, the circuit branches 401 and 402 comprise the same transfer function H(s).

As shown in equation (3), the transfer function H(s) comprises a first zero at a low frequency, a second zero at an intermediate frequency, and a pole between the first and the second zeros. The pole between the first and the second zeros may reduce the slope in a frequency range between the low frequency and the intermediate frequency in the frequency response to revert channel loss in the corresponding frequency range. The second zero is located at a frequency $Z_2$ as follows:

$$Z_2 = -\frac{R_S C_S + (R_S + R_t)C_{gd}}{R_S C_S R_t C_{gd}} \quad (4)$$

$$\approx -\left(1 + \frac{R_S}{R_t}\right)\frac{1}{R_S C_S}$$

The first zero is located at a frequency $Z_1$ as follows:

$$Z_1 = -\frac{1}{R_S C_S + (R_S + R_t)C_{gd}} \quad (5)$$

$$\approx -\frac{1}{(R_t + R_S)C_{gd}}$$

The first pole is located at a frequency $P_1$ as follows:

$$P_1 = -\frac{1}{R_t C_{gd}}$$

Thus, the resistance of the resistor 437 may be configured according to the fixed gate-drain parasitic capacitance of the transistor 431 such that $Z_1$ is at a desired frequency. Similarly, the resistance of the resistor 421 and the capacitance of the capacitor 423 may be configured such that $Z_2$ is at another desired frequency. The frequency $Z_2$ is at a higher frequency than $Z_1$. As such, the first and second zeros may be placed such that the frequency response of the circuit 400 may provide gains at a low-frequency range of a signal bandwidth for long-term ISI compensation. The circuit 400 also produces two conjugate poles to form a peak at a Nyquist frequency, where the two conjugate poles are contributed by the inductors 415 or 416 in the differential amplifier circuit 410. For example, to equalize a channel that attenuates signals with increasing frequencies beginning at about 100 MHz and rapidly rolls off at about 1 GHz, $R_S$ and $C_S$ may be configured to produce the second zero at about 1 GHz, and $R_t$ may be configured according to $C_{gd}$ to produce the first zero at about 100 MHz.

Figure 5:
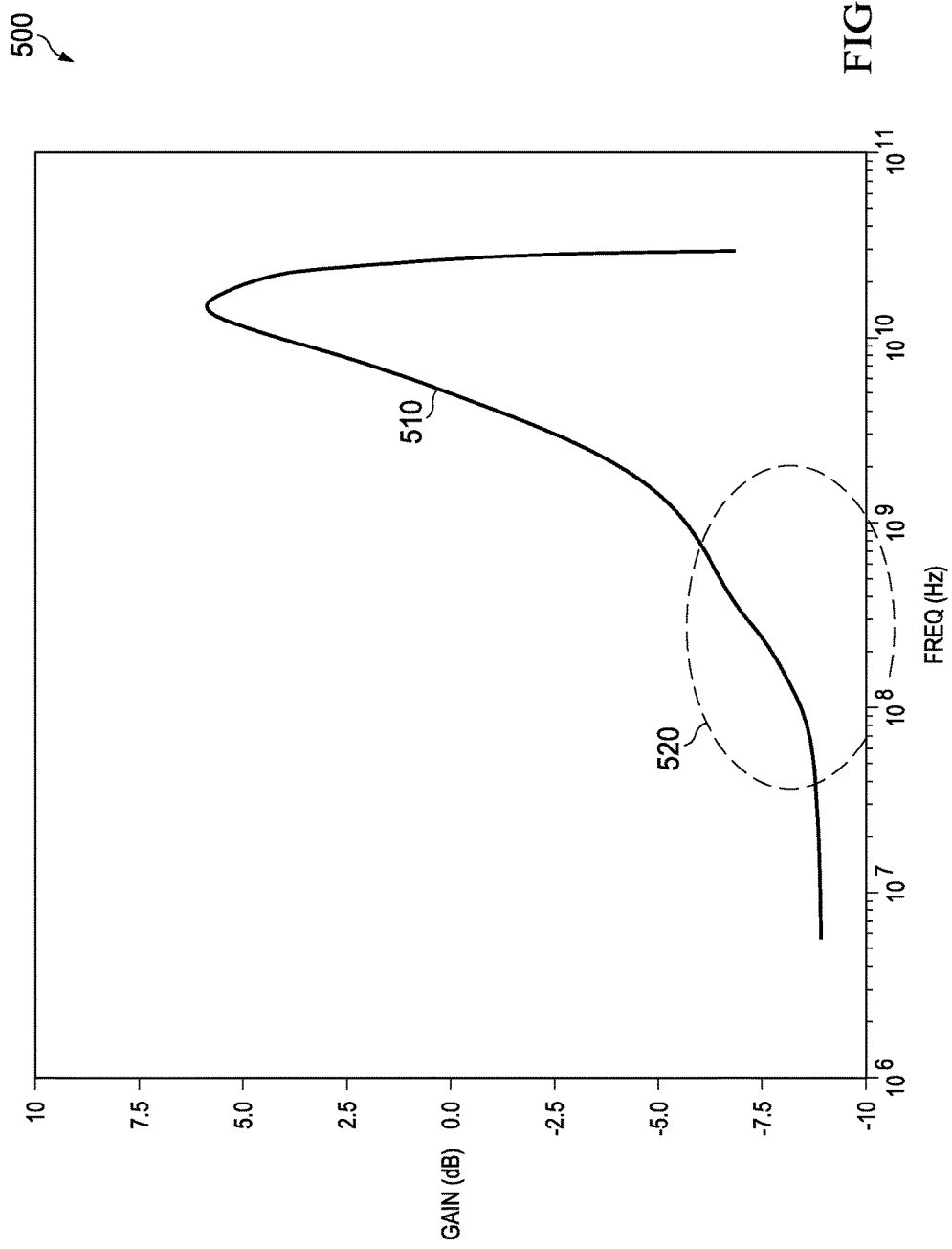
FIG. 5 is a graph illustrating a frequency response of the CTLE circuit of FIG. 4 according to an embodiment of the disclosure.

FIG. 5 is a graph 500 illustrating a frequency response 510 of the CTLE circuit 400 according to an embodiment of the disclosure. The x-axis represents frequency in units of Hz in a logarithmic scale. The y-axis represents gains in units of dB. The frequency response 510 is produced by configuring the circuit 400 to equalize the channel response 210. For example, the resistance of the resistor 421 and the capacitance of the capacitor 423 are configured to produce a zero at about 1 GHz in the frequency response of the circuit branch 401. Similarly, the resistance of the resistor 422 and the capacitance of the capacitor 424 are configured to produce a zero at about 1 GHz in the frequency response of the circuit branch 402. The resistances of the resistors 437 and 438 are configured according to the gate-drain parasitic capacitances of the transistors 431 and 432 to produce a zero at about 100 MHz in the frequency response of the circuit branch 401 and the frequency response of the circuit branch 402. In addition, the inductance of the inductors 415 and 416, are configured to produce two conjugate poles to form a peak at about 14 GHz. Comparing the frequency response 510 to the frequency response 310, in addition to gain or peaking at high frequencies, the frequency response 510 provides gain in the region 520 between about 100 MHz to about 1 GHz. Thus, the circuit 400 may compensate channel loss at both low and high frequencies. Therefore, the circuit 400 may equalize both long-term and short-term ISI instead of only short-term ISI as in the circuit 100.

Figure 6:
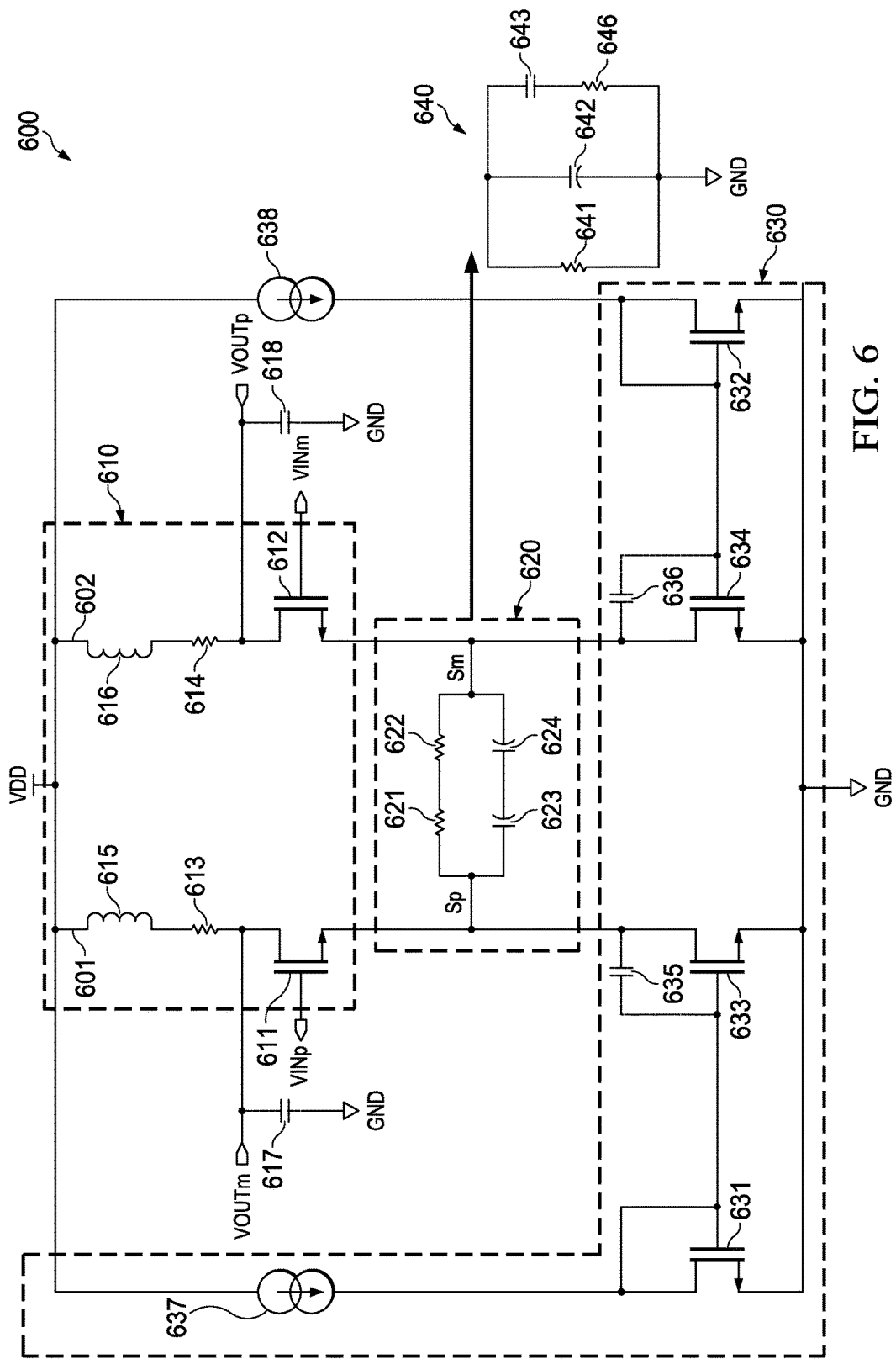
FIG. 6 is a schematic diagram of a CTLE circuit that compensates both high-frequency channel loss and low-frequency channel loss according to another embodiment of the disclosure.

FIG. 6 is a schematic diagram of a CTLE circuit 600 that compensates both high-frequency channel loss and low-frequency channel loss according to another embodiment of the disclosure. Similar to the circuit 400, the circuit 600 produces two zeros, one at a low frequency and another at an intermediate frequency, in a frequency response of the circuit 600. However, the circuit 600 comprises two identical reference current sources 637 and 638 instead of a single reference current source 434 as in the circuit 400. The circuit 600 employs the transconductances of the transistors 631 and 632 to generate the first pole and the first zero instead of resistors such as the resistors 437 and 438. The circuit 600 comprises a differential amplifier circuit 610, a frequency-shaping circuit 620, and a bias circuit 630. The differential amplifier circuit 610 comprises two matched NMOS transistors 611 and 612, two matched resistors 613 and 614, and two matched inductors 615 and 616 arranged in a similar configuration as in the differential amplifier circuit 410. The gates of the transistors 611 and 612 are provided as input terminals VINP and VINM, respectively. The drains of the transistors 611 and 612 are provided as output terminals VOUTP and VOUTM, respectively. The capacitance at the output terminals VOUTP and VOUTM are represented as capacitors 617 and 618. The frequency-shaping circuit 620 comprises two matched resistors 621 and 622 and two matched capacitors 623 and 624 arranged in a similar configuration as in the frequency-shaping circuit 420. The differential amplifier circuit 610 and the frequency-shaping circuit 620 are coupled at connection nodes SP and SM. Similar to the circuit 400, the circuit 600 may be viewed as two symmetrical differential branches 601 and 602 connected in parallel.

The bias circuit 630 comprises four NMOS transistors 631, 632, 633, and 634 and two matched reference current sources 637 and 638. The reference current source 637 is coupled between the drain of the transistor 631 and a power supply voltage $V_{DD}$. The reference current source 638 is coupled between the drain of the transistor 632 and $V_{DD}$. The drains of the transistors 633 and 634 are connected to the sources of the transistors 611 and 612, respectively. The gate and drain of the transistor 631 are connected to each other and to the gate of the transistor 633. The gate and drain of the transistor 632 are connected to each other and to the gate of the transistor 634. The sources of the transistors 631-634 are connected to a ground shown as GND. The reference current source 637 and the transistors 631 and 633 provide a bias current source to the circuit branch 601. The reference current source 638 and the transistors 632 and 634 provide a bias current source to the circuit branch 602.

Similar to the transistors 131, 132, 431, and 432, the transistors 633 and 634 comprise parasitic capacitances across the gates and the sources represented as capacitors 635 and 636, respectively. The circuit 640 illustrates the equivalent half RC network across the connection nodes SP and SM. The circuit 640 comprises resistors 641 and 646 and capacitors 642 and 643 arranged in a similar configuration as the circuit 440. When representing the half-circuit in the circuit positive signal branch 601, the resistor 641 corresponds to the resistor 621, the resistor 646 represents the transconductance of the transistor 631, and the capacitors 642 and 643 correspond to the capacitors 623 and 635, respectively. When representing the half-circuit in the circuit branch 602, the resistor 641 corresponds to the resistor 622, the resistor 646 represents the transconductance of the transistor 632, and the capacitors 642 and 643 correspond to the capacitors 624 and 636, respectively. The resistor 641 and the capacitor 642 produce a second zero in the frequency response of the circuit 640. The resistors 641 and 646 and the capacitor 643 produce a first zero and a first pole in the frequency response.

The transfer function of the circuit 600 may be represented as a function of the components in the circuit 600. As an example, the resistances of the resistors 621 and 613 are represented as $R_S$ and $R_D$, respectively; the capacitances of the capacitors 623, 635, and 617 are represented as $C_S$, $C_{gd}$, and $C_L$, respectively; and the transconductances of the transistor 611 and the transistor 631 are represented as $g_{mD}$ and $g_{mCR}$. Thus, the transfer function or frequency response $H(s)$ of the circuit 600 is expressed as shown below:

$$H(s) = -\frac{R_D}{R_S} \frac{\left(1 + s \frac{R_s C_s (1/g_{mCR}) C_{gd}}{R_s C_s + (R_s + 1/g_{mCR}) C_{gd}}\right)\left(1 + s(R_s C_s + (R_s + 1/g_{mCR}) C_{gd})\right)\left(1 + s \frac{L}{R_D}\right)}{(1 + s C_{gd}/g_{mCR})\left(1 + s \frac{C_s}{g_{mD}}\right)(1 + s R_D C_L + s^2 L C_L)} \quad (7)$$

The transfer function $H(s)$ of the circuit 600 comprises a first zero at a low frequency, a second zero at an intermediate frequency and a pole between these two zeros. The pole between the first and the second zeros may reduce the slope in a frequency range between the low frequency and the intermediate frequency in the frequency response to revert channel loss in the corresponding frequency range. The second zero is located at a frequency $Z_2$ as follows:

$$Z_2 = -\frac{R_S C_S + (R_S + 1/G_{MCR}) C_{GD}}{R_S C_S (1/G_{MCR}) C_{GD}} \quad (8)$$

$$\approx -(1 + R_S G_{MCR}) \frac{1}{R_S C_S}.$$

The first zero is located at a frequency $Z_1$ as follows:

$$Z_1 = -\frac{1}{R_s C_s + (R_s + 1/g_{mCR}) C_{gd}} \quad (9)$$

-continued $$\approx -\frac{1}{(1/g_{mCR}+R_s)C_{gd}}.$$

The first pole is located at a frequency $P_1$ as follows:

$$P_1 = -\frac{g_{mCR}}{C_{gd}} \qquad (10)$$

Thus, the tranconductance of the transistor 631 may be configured according to the fixed gate-drain parasitic capacitance of the transistor 633 such that $Z_1$ is at a desired frequency. Similarly, the resistance of the resistor 621 and the capacitance of the capacitor 623 may be configured such that $Z_2$ is at another desired frequency. $Z_2$ is at a higher frequency than $Z_1$. As such, the first and second zeros may be placed such that the frequency response of the circuit 600 may provide gains at a low-frequency range of a signal bandwidth for long-term ISI compensation. The circuit 600 also produces two conjugate poles to form a peak at a Nyquist frequency. For example, to equalize a channel that attenuates signals with increasing frequencies beginning at about 100 MHz and rapidly rolls off at about 1 GHz, $R_S$ and $C_S$ may be configured to produce the second zero at about 1 GHz, and $g_{mCR}$ may be configured according to $C_{gd}$ to produce the first zero at about 100 MHz.

Figure 7:
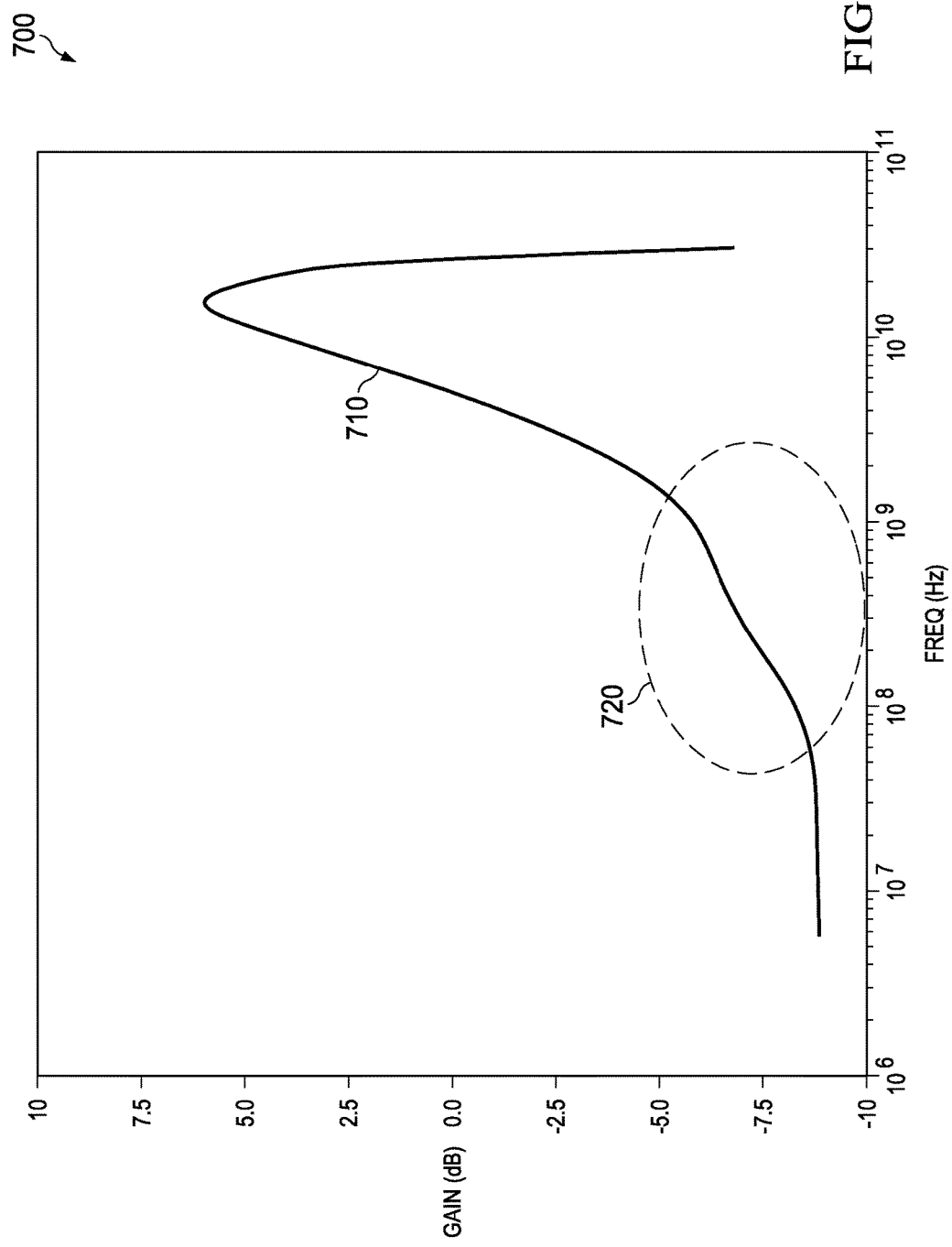
FIG. 7 is a graph illustrating a frequency response of the CTLE circuit of FIG. 6 according to an embodiment of the disclosure.

FIG. 7 is a graph 700 illustrating a frequency response 710 of the CTLE circuit 600 according to an embodiment of the disclosure. The x-axis represents frequency in units of Hz in a logarithmic scale. The y-axis represents gains in units of dB. The frequency response 710 is produced by configuring the circuit 600 to equalize the channel response 210. For example, the resistances of the resistors 621 and 622 and the capacitances of the capacitors 623 and 624 are configured to produce a zero at about 1 GHz corresponding to the gains seen above 1 GHz in the frequency response 710. The transistors 631 and 632 are configured such that the transconductances of the transistors 631 and 632 and the gate-drain parasitic capacitances of the transistors 633 and 634 produce a zero at about 100 MHz. In addition, the inductances of the inductors 615 and 616 are configured to produce two conjugate poles to form a peak at about 14 GHz. Similar to the frequency response 510, the frequency response 710 provides low-frequency gain in the low frequency region 720 between about 100 MHz and about 1 GHz and high-frequency gain between about 1 GHz and 14 GHz. Therefore, the circuit 600 may equalize both long-term and short-term ISI as in the circuit 400.

Figure 8:
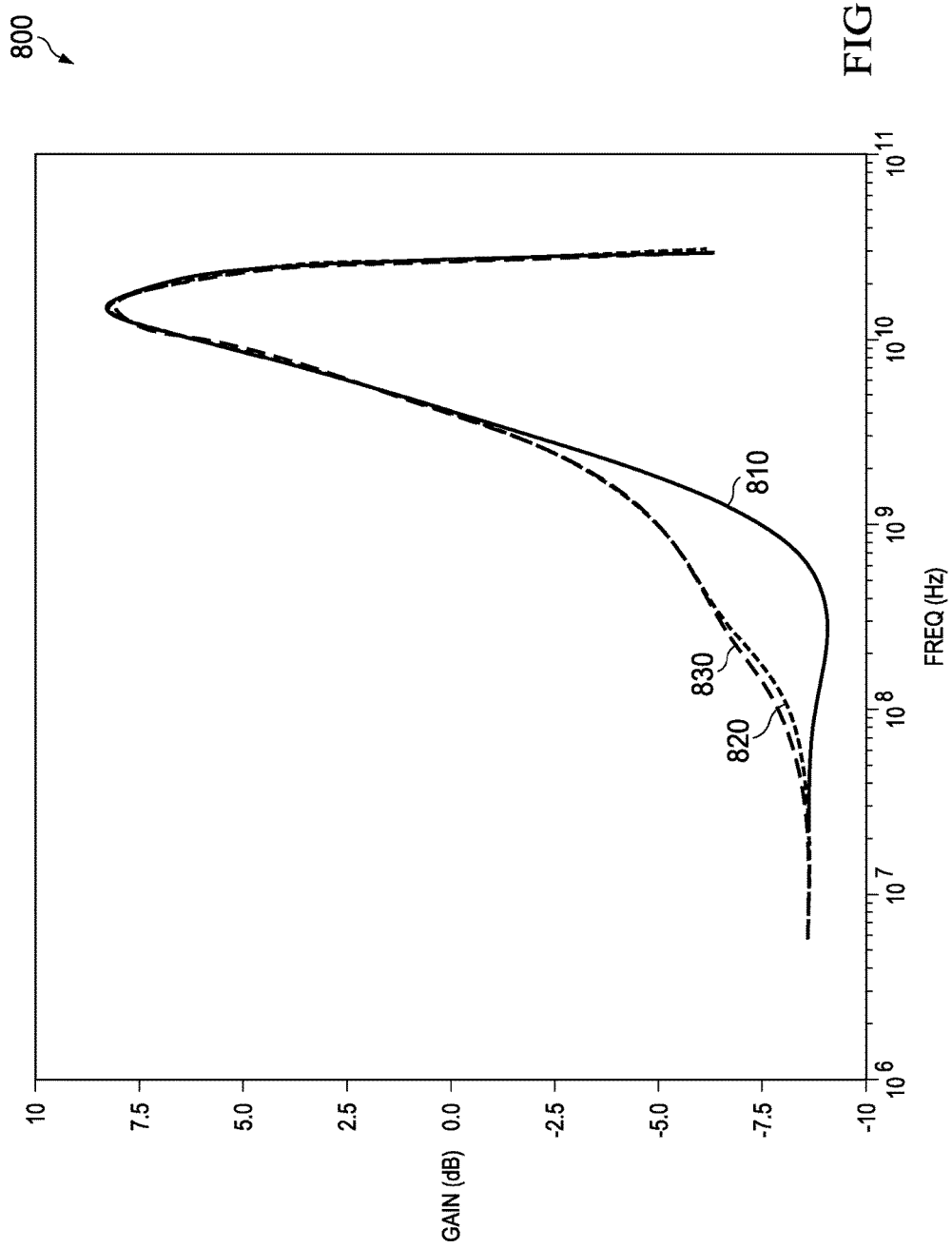
FIG. 8 is a graph comparing performance of the CTLE circuits of FIGS. 1, 4, and 6 according to an embodiment of the disclosure.

FIG. 8 is a graph 800 comparing performance of the circuits 100, 400, and 600 according to an embodiment of the disclosure. The frequency responses 310, 510, and 710 are overlaid for performance comparison. The curve 810 corresponds to the frequency response 310 of the circuit 100. The curve 820 corresponds to the frequency response 510 of the circuit 400. The curve 830 corresponds to the frequency response 710 of the circuit 600. As shown, the curve 820 and 830 are lifted up in the frequency range between about 100 MHz to about 3 GHz, whereas the curve 810 of the circuit 100 is almost flat in the same frequency range. Thus, the circuits 400 and 600 improve equalization performance when compared to the circuit 100.

Figure 9:
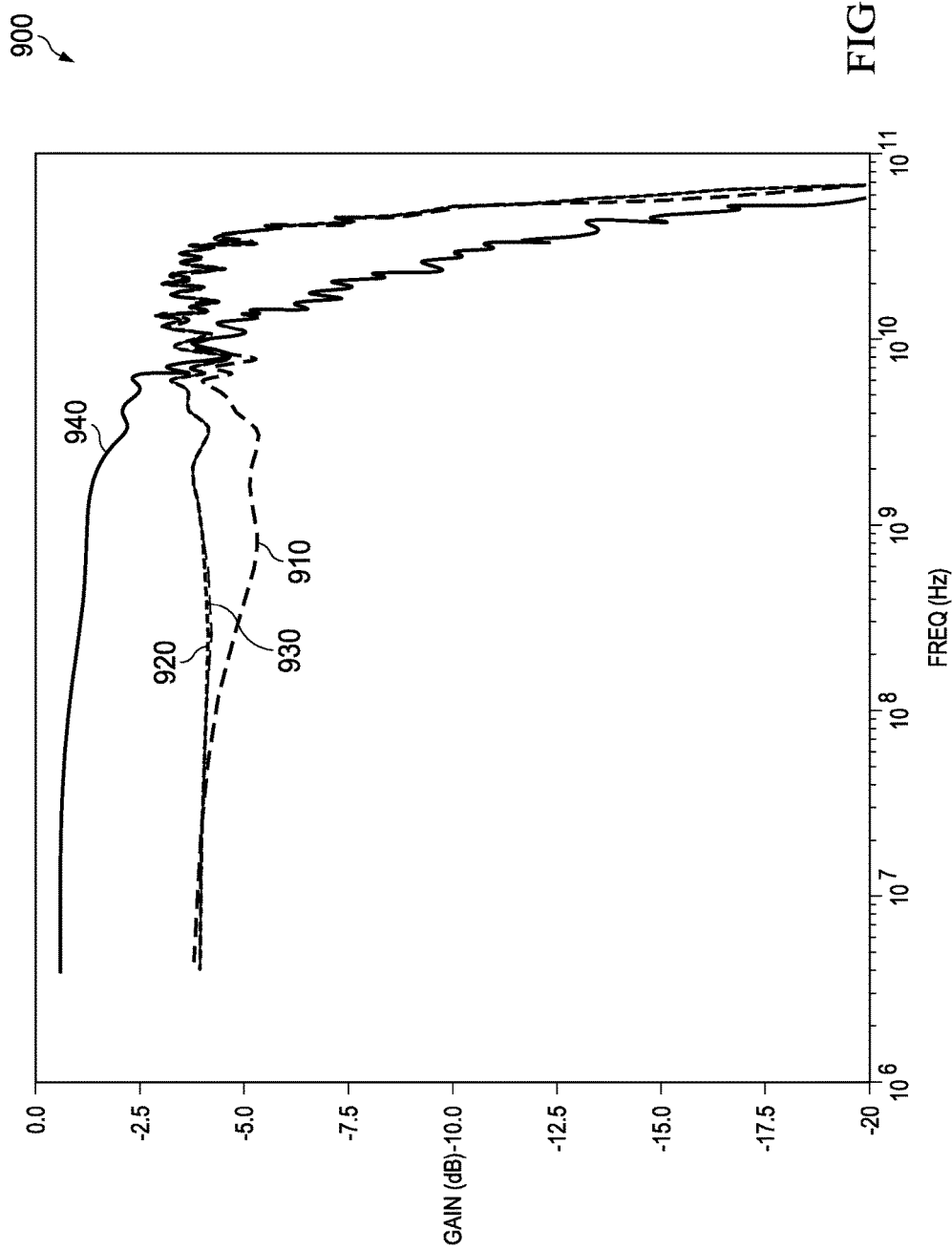
FIG. 9 is a graph comparing performance of the CTLE circuits of FIGS. 1, 4, and 6 according to another embodiment of the disclosure.

FIG. 9 is a graph 900 comparing performance of the circuits 100, 400, and 600 according to another embodiment of the disclosure. The graph 900 is generated by equalizing a signal transmitted over a transmission link comprising a channel response as shown in the channel response 210. The curve 940 shows a frequency spectrum of a received signal propagated though the transmission link prior to equalization. The received signal is applied to each of the circuits 100, 400, and 600 at the input terminals VINP and VINM. The curve 910 shows the frequency response of the received signal measured at the output terminals of the circuit 100. The curve 920 shows the frequency response of the received signal measured at the output terminals of the circuit 400. The curve 930 shows the frequency response of the received signal measured at the output terminals of the circuit 600. As shown, the curves 920 and 930 are substantially flat across the signal bandwidth, whereas the curve 910 dips between 100 MHz to about 3 GHz. Thus, the circuits 400 and 600 provide improved equalization performance when compared to the circuit 100.

Figure 10:
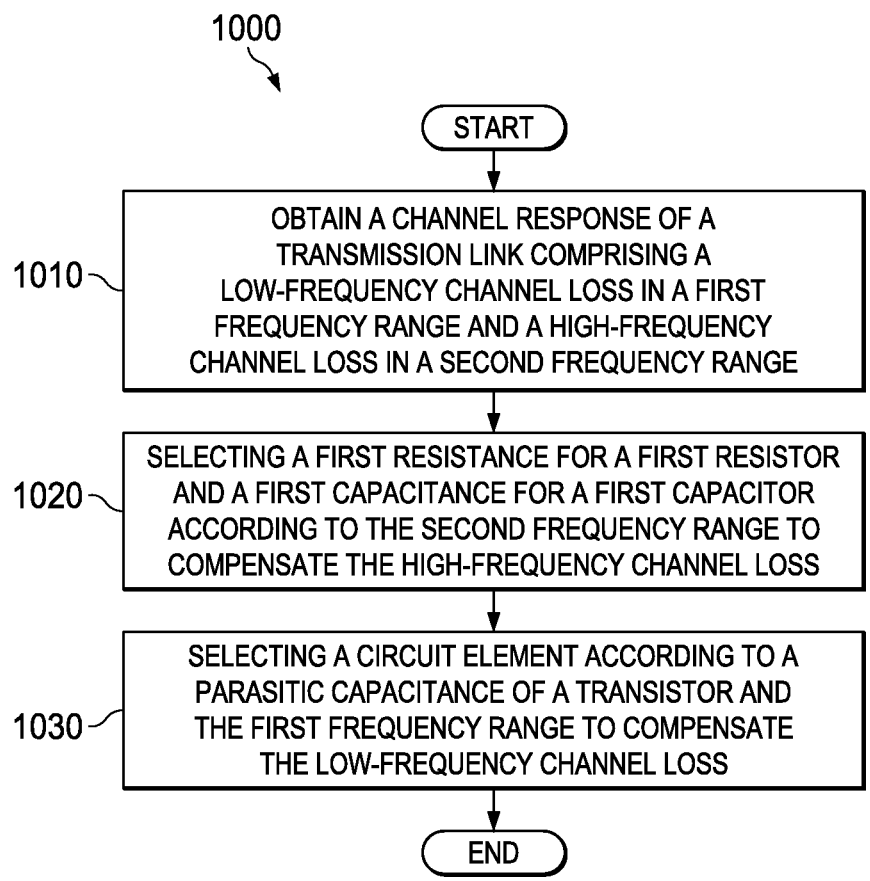
FIG. 10 is a flowchart of a method for configuring a CTLE to provide equalization at both high and low frequencies according to an embodiment of the disclosure.

FIG. 10 is a flowchart of a method 1000 for configuring a CTLE to provide equalization at both high and low frequencies according to an embodiment of the disclosure. The method 1000 may be employed to select circuit components for the circuits 400 and 600. At step 1010, a channel response of a transmission link comprising a low-frequency channel loss in a first frequency range and a high-frequency channel loss in a second frequency range is obtained. For example, the channel response may be similar to the channel response 210. Based on the channel response, the placements of poles and zeros may be determined to reverse or compensate the high-frequency channel loss and the low-frequency channel loss. For example, a first pole and a first zero may be placed within the low-frequency range to compensate the low-frequency channel loss and a second zero may be place within the high-frequency range to compensate the high-frequency channel loss. At step 1020, a first resistance for a first resistor and a first capacitance for a first capacitor are selected according to the second frequency range to compensate the high-frequency channel loss. For example, the first resistor and the first capacitor may correspond to the resistor 421 and the capacitor 423, the resistor 422 and the capacitor 424, the resistor 621 and the capacitor 623, or the resistor 622 and the capacitor 624. The first resistance and the first capacitance may be selected according to the equation (4). At step 1030, a circuit element is selected according to a parasitic capacitance of a transistor such as a gate-drain parasitic capacitance and the first frequency range to compensate the low-frequency channel loss. For example, when employing circuit 400, the circuit element corresponds to the resistor 437 or 438, which may be selected according to equation (5) and (6). Alternatively, when employing the circuit 600, the circuit element corresponds to the transistors 631 or 632, which may be selected according to equation (9) and (10).

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
   an input port configured to receive an input signal propagated through a transmission link experiencing a low-frequency channel loss and a high-frequency channel loss;
   a continuous-time linear equalization (CTLE) circuit coupled to the input port, the CTLE circuit comprising:
      a differential amplifier circuit coupled to the input port, the differential amplifier circuit comprising a first circuit branch connected in parallel to a second circuit branch; and
      a bias circuit coupled to the differential amplifier circuit, the bias circuit comprising a first transistor coupled to the first circuit branch and configured to provide a first direct current (DC) bias to the first circuit branch, a second transistor coupled to the second circuit branch and configured to provide a second DC bias to the second circuit branch, and a first resistor positioned between the first transistor and the second transistor,
   wherein the CTLE circuit is configured to produce an output signal according to the input signal by:
      applying a first gain to the input signal based on a first frequency to compensate the low-frequency channel loss; and
      applying a second gain to the input signal based on a second frequency to compensate the high-frequency channel loss; and
   an output port coupled to the CTLE circuit and outputting the output signal, wherein a frequency response of the CTLE circuit between the output port and the input port comprises a first zero and a second zero, the first zero dependent on a first parasitic capacitance of the first transistor and on a first resistance of the first resistor, the first frequency associated with the first zero, and the second frequency associated with the second zero.

2. The apparatus of claim 1, wherein the bias circuit further comprises:
   a second resistor positioned between the first resistor and the second transistor;
   a reference current source coupled to a power supply; and
   a third transistor coupled to the reference current source, a ground, the first resistor, and the second resistor.

3. The apparatus of claim 2, wherein the second resistor comprises a second resistance that is identical to the first resistance, and wherein the first transistor, the second transistor, and the third transistor are n-channel metal-oxide semiconductor (NMOS) transistors.

4. The apparatus of claim 1, wherein the CTLE circuit comprises:
   a frequency-shaping circuit positioned between the first circuit branch and the second circuit branch, wherein the frequency-shaping circuit comprises a resistor connected in parallel to a capacitor,
   wherein the second frequency is dependent on a resistance of the resistor and a capacitance of the capacitor.

5. The apparatus of claim 1, wherein the CTLE circuit is further configured to apply a third gain to the input signal based on a Nyquist frequency of the input signal, and wherein the first circuit branch comprises:
   a transistor;
   a resistor coupled to the transistor; and
   an inductor positioned between the resistor and a power supply and comprising an inductance associated with the Nyquist frequency of the input signal.

6. The apparatus of claim 1, wherein the apparatus is an optical receiver operating at about 100 gigabits per second (Gbps).

7. An apparatus comprising:
   a power supply;
   a reference current source coupled to the power supply;
   a differential amplifier circuit comprising a first circuit branch and a second circuit branch connected to each other in parallel;
   a first transistor comprising a first gate, a first drain, and a gate-drain parasitic capacitance, the first drain is coupled to the first circuit branch;
   a second transistor comprising a second gate and a second drain, the second drain is coupled to the second circuit branch;
   a first resistor coupled to the first gate and comprising a first resistance based on the gate-drain parasitic capacitance;
   a second resistor coupled to the first resistor and the second gate such that the second resistor is positioned between the first resistor and the second gate; and
   a third transistor coupled to the reference current source, wherein the third transistor comprises a third gate, a third drain, and a third source, and wherein the third gate is connected to the third drain and coupled to a node between the first resistor and the second resistor.

8. The apparatus of claim 7, wherein the second resistor comprises the first resistance.

9. The apparatus of claim 7, wherein the first transistor and the second transistor are n-channel metal-oxide semiconductor (NMOS) transistors.

10. The apparatus of claim 7, wherein the apparatus comprises a frequency response, wherein the frequency response comprises a first zero, and wherein the first resistance is configured to cause the first zero to be at a first zero frequency that compensates for low-frequency channel loss.

11. The apparatus of claim 7, wherein the apparatus comprises a frequency response, wherein the frequency response comprises a first zero, and wherein the first resistance is configured to cause the first zero to be at a first zero frequency that compensates for long-term inter-symbol interference (ISI).

12. The apparatus of claim 7, wherein the first transistor, the second transistor, the first resistor, and the second resistor are part of a bias circuit.

13. The apparatus of claim 12, further comprising a frequency-shaping circuit coupled to the differential amplifier circuit and the bias circuit so that the frequency-shaping circuit is positioned between the differential amplifier circuit and the bias circuit.

14. The apparatus of claim 13, wherein the frequency-shaping circuit comprises:
   a third resistor coupled to the first circuit branch and the first drain and comprising a third resistance; and
   a first capacitor coupled to the first circuit branch and the first drain and comprising a first capacitance.

15. The apparatus of claim 14, wherein the apparatus comprises a frequency response, wherein the frequency response comprises a second zero, and wherein the third resistance and the first capacitance are configured to cause the second zero to be at a second zero frequency that compensates for high-frequency channel loss.

16. The apparatus of claim 14, wherein the apparatus comprises a frequency response, wherein the frequency response comprises a second zero, and wherein the third resistance and the first capacitance are configured to cause the second zero to be at a second zero frequency that compensates for short-term inter-symbol interference (ISI).

17. The apparatus of claim 7, wherein the apparatus comprises a frequency response, wherein the frequency response comprises a Nyquist frequency, and wherein the differential amplifier circuit further comprises:
 a first inductor on the first circuit branch and comprising a first inductance; and
 a second inductor on the second circuit branch and comprising a second inductance,
 wherein the first inductance and the second inductance are configured to form a peak at the Nyquist frequency in order to provide a high-frequency gain for short-term inter-symbol interference (ISI) compensation.

18. An apparatus comprising:
 a differential amplifier circuit comprising a first circuit branch and a second circuit branch connected to each other in parallel;
 a first transistor comprising a first gate, a first drain, and a gate-drain parasitic capacitance, the first drain is coupled to the first circuit branch;
 a second transistor comprising a second gate and a second drain, the second drain is coupled to the second circuit branch;
 a first resistor coupled to the first gate and comprising a first resistance based on the gate-drain parasitic capacitance; and
 a second resistor coupled to the first resistor and the second gate such that the second resistor is positioned between the first resistor and the second gate,
 wherein the first circuit branch comprises:
  a power supply;
  an input terminal;
  an output terminal;
  an inductor coupled to the power supply;
  a third resistor coupled to the inductor; and
  a third transistor comprising a third drain coupled to the third resistor and the output terminal, a third gate coupled to the input terminal, and a third source coupled to the first drain.

* * * * *